US011512499B2

(12) United States Patent
Gao et al.

(10) Patent No.: US 11,512,499 B2
(45) Date of Patent: Nov. 29, 2022

(54) CONTROL CIRCUIT AND CONTROL METHOD FOR SMART LOCK

(71) Applicant: SHENZHEN KAADAS INTELLIGENT TECHNOLOGY CO., LTD, Guangdong (CN)

(72) Inventors: Shunde Gao, Guangdong (CN); Yexin Chen, Guangdong (CN)

(73) Assignee: SHENZHEN KAADAS INTELLIGENT TECHNOLOGY CO., LTD, Shenzhen (CN)

(*) Notice: Subject to any disclaimer, the term of this patent is extended or adjusted under 35 U.S.C. 154(b) by 816 days.

(21) Appl. No.: 16/437,004

(22) Filed: Jun. 11, 2019

(65) Prior Publication Data
US 2020/0123810 A1 Apr. 23, 2020

(30) Foreign Application Priority Data

Oct. 23, 2018 (CN) .......................... 201811240780.1

(51) Int. Cl.
E05B 47/00 (2006.01)
E05B 17/00 (2006.01)
(Continued)

(52) U.S. Cl.
CPC ...... *E05B 47/0012* (2013.01); *E05B 17/0083* (2013.01); *E05B 17/10* (2013.01);
(Continued)

(58) Field of Classification Search
CPC .. E05B 47/0012; E05B 17/0083; E05B 17/10; E05B 2047/0067; E05B 2047/0048;
(Continued)

(56) References Cited

U.S. PATENT DOCUMENTS 4,744,021 A * 5/1988 Kristy ................ G07C 9/00182
700/12
5,339,662 A * 8/1994 Goldman ............ E05B 47/0002
70/432

(Continued)

FOREIGN PATENT DOCUMENTS

CN 201397528 5/2009
CN 203759776 8/2014
(Continued)

OTHER PUBLICATIONS

CN207424968U_Description.pdf; translation of CN 207424968U; Zhou Xinsheng and Shi Yongjun; a control circuit and control method for intelligent lock; Zhenzhen Kaidishi Intelligent technology Co., Ltd; May 29, 2018. (Year: 2018).*

*Primary Examiner* — Nam V Nguyen
(74) *Attorney, Agent, or Firm* — Rankin, Hill & Clark LLP

(57) ABSTRACT

A circuit for a smart lock includes a state detection unit, a main control chip and a motor driving unit, the state detection unit includes optocoupler sensors U21, U31 and a Hall sensor; the optocoupler sensor U21 is configured to form a first in-position signal, the optocoupler sensor U31 is configured to form a second in-position signal, the Hall sensor is configured to detect whether the state of the lock body is unlocked in position so as to form an auxiliary signal; the main control chip is configured to output a control signal according to the first and second in-position signals and the auxiliary signal; and the motor driving unit is configured to drive the motor to rotate forward or reverse or stop rotating according to the control signal.

9 Claims, 15 Drawing Sheets

(51) Int. Cl.
  *E05B 17/10* (2006.01)
  *G01D 5/14* (2006.01)
  *G01D 5/34* (2006.01)
  *G07C 9/00* (2020.01)
  *G07C 9/37* (2020.01)

(52) U.S. Cl.
  CPC ............ *G01D 5/145* (2013.01); *G01D 5/342* (2013.01); *G07C 9/00563* (2013.01); *G07C 9/37* (2020.01); *E05B 2047/0067* (2013.01)

(58) Field of Classification Search
  CPC .... G01D 5/145; G01D 5/342; G07C 9/00563; G07C 9/37; G07C 9/00174; H03K 17/97; H03K 2017/9713; H03K 17/941
  USPC ......................................... 340/5.7; 324/207.2
  See application file for complete search history.

(56) References Cited

U.S. PATENT DOCUMENTS

| | | | | |
|---|---|---|---|---|
| 5,808,555 A | * | 9/1998 | Bartel | G05B 19/0423 70/264 |
| 7,420,456 B2 | * | 9/2008 | Fisher | E05B 19/0005 340/5.28 |
| 7,482,907 B2 | * | 1/2009 | Denison | H04Q 1/00 340/5.1 |
| 8,686,869 B2 | * | 4/2014 | Sharma | G01D 5/268 70/276 |
| 9,871,399 B2 | * | 1/2018 | Mittleman | E05B 41/00 |
| 2002/0099965 A1 | * | 7/2002 | Yang | G06F 21/32 713/322 |
| 2005/0261804 A1 | | 11/2005 | Doty | |
| 2017/0193762 A1 | * | 7/2017 | Warren | G08B 3/10 |

FOREIGN PATENT DOCUMENTS

| | | |
|---|---|---|
| CN | 205665762 | 10/2016 |
| CN | 205743311 | 11/2016 |
| CN | 207216729 | 4/2018 |
| CN | 207424968 | 5/2018 |
| CN | 108661449 | 10/2018 |
| CN | 207934626 | 10/2018 |
| CN | 207960217 | 10/2018 |
| CN | 207993107 | 10/2018 |

* cited by examiner

CONTROL CIRCUIT AND CONTROL METHOD FOR SMART LOCK

CROSS-REFERENCES TO RELATED APPLICATION

This application claims priority to Chinese Patent Application 201811240780.1, filed on Oct. 23, 2018, the content of which is incorporated herein by reference in its entirety.

TECHNICAL FIELD

The present disclosure relates to a lock, and more particularly to a control circuit and a control method for a smart lock.

BACKGROUND

The lock body is one of the components of the lock, and there are many kinds of lock bodies, the common ones are a one-way lock body, a three-way lock body, a four-way lock body, etc., which are generally used on the security door, and are responsible for the basic anti-theft of the security door. The lock cylinder is used to control the operation of the lock body. The lock body is responsible for opening and locking the door and window, and plays an important role in theft prevention.

With the development of science and technology, more and more smart locks are welcomed by people. When using smart locks, it is natural to detect and control the various states of smart locks. In current schemes touch switches are all used for position detection, and the main control chip is used to drive the motor of the smart lock to perform forward rotation and reverse rotation and stop rotation. However, this detection scheme is not suitable for the dead bolt lock. The touch switch cannot be used in the dead bolt lock, so current schemes have certain limitation.

Therefore, it is necessary to design a control circuit, which can be applied to the state detection and control of the ordinary smart lock, and is also suitable for the state detection and control of the dead bolt lock, and has strong applicability.

SUMMARY

An object of the present application is to overcome the deficiencies of the prior art and to provide a control circuit and a control method for a smart lock.

To achieve the above object, the present application adopts the following technical solution: a control circuit for a smart lock, comprising: a state detection unit, a main control chip U3, and a motor driving unit; where the state detection unit comprises optocoupler sensors U21, U31 and a Hall sensor VR1, the optocoupler sensors U21, U31 and the Hall sensor VR1 are respectively disposed in a lock body of the smart lock; the optocoupler sensor U21 is configured to detect whether state of the lock body is locked in position and a motor is retracted in position so as to form a first in-position signal, the optocoupler sensor U31 is configured to detect whether the state of the lock body is unlocked in position and the motor is retracted in position so as to form a second in-position signal, the Hall sensor VR1 is configured to detect whether the state of the lock body is unlocked in position so as to form an auxiliary signal; the main control chip U3 is configured to output a control signal according to the first in-position signal, the second in-position signal and the auxiliary signal; and the motor driving unit is configured to be connected to the motor and to drive the motor to rotate forward or reverse or stop rotating according to the control signal.

In a further technical solution, the control circuit further comprises a lock body power supply control element Q21, and the lock body power supply control element Q21 being turned on or off according to a control signal so as to energize or de-energize the lock body.

In a further technical solution, the motor driving unit comprises a motor drive chip U8, the motor drive chip U8 is connected to the main control chip U3 through voltage stabilizing resistors R50, R51, and the motor drive chip U8 is also connected to the main control chip U3 through a detecting resistor R49.

In a further technical solution, the control circuit further comprises a clock unit connected to the main control chip U3, the clock unit comprises a clock chip U10, and pins of the clock chip U10 are also connected to an oscillator CY2.

In a further technical solution, the control circuit further comprises a voice unit connected to the main control chip U3, the voice unit comprises a voice chip U9, and voltage stabilizing resistor R52, R53 and a filter capacitor C41 grounded at one end are connected between the voice unit U9 and the main control chip U3.

In a further technical solution, the control circuit further comprises an indication unit connected to the main control chip U3, the indication unit comprises indicator light drive chips U18, U19, and pins of the indicator light driving chips U18 and U19 are respectively connected with indicator lights.

In a further technical solution, the control circuit further comprises a fingerprint unit, a touch unit and a Bluetooth unit respectively connected to the main control chip U3, and the touch unit comprises a touch chip U5, the fingerprint unit comprises a fingerprint chip U11, and the Bluetooth unit includes a Bluetooth chip U13.

In a further technical solution, the control circuit further comprises a power supply unit, the power supply unit comprises power management chips U6, U7, U14 which are respectively connected to a voltage stabilizing module, the power management chips U6 is connected to the indication unit, the touch unit, the clock unit, and the lock body power supply control element Q21, the power management chip U7 is connected to the voice unit, and the power management chip U14 is connected to the Bluetooth unit.

In a further technical solution, the control circuit further comprises a low voltage detection unit connected to the main control chip U3, the low voltage detection unit comprising detecting resistors R44, R45, R46 and a capacitor C34 connected to the power supply unit, and the capacitor C34 and the resistor R45 are respectively connected to the main control chip U3.

The present application further provides a control method for a control circuit for a smart lock, comprising:

an optocoupler sensor U21 detects whether state of a lock body is locked in position and a motor is retracted in position so as to form a first in-position signal;

an optocoupler sensor U31 detects whether the state of the lock body is unlocked in position and the motor is retracted in position so as to form a second in-position signal; a Hall sensor VR1 detects whether the state of the lock body is unlocked in position so as to form an auxiliary signal; a main control chip U3 outputs a control signal according to the first in-position signal, the second in-position signal and the auxiliary signal; the motor driving unit 2 drives the motor to rotate forward or reverse or stop rotating according to the control signal.

The beneficial effects of the present invention compared to the prior art are: in the present application, the state detection unit 1, the main control chip U3 and the motor driving unit 2 are configured, where the state detection unit 1 includes the optocoupler sensors U21, U31 and the Hall sensor VR1, the optocoupler sensor U21, U31 and the Hall sensor VR1 are used together to detect the locking and unlocking in-position state of the lock body and cooperate with the motor driving unit 2 to realize the retraction of the motor, and the direction of the locking is switched by the changeover setting unit 6 so that the smart lock has two kinds of locking modes, enabling the smart lock to be applied to the left open door or the right open door, which improves the practicality of the smart lock. The control circuit can be applied to the state detection and control of the ordinary smart lock, and is also suitable for the state detection and control of the dead bolt lock, and has strong applicability.

BRIEF DESCRIPTION OF THE DRAWINGS

In order to more clearly illustrate the technical solutions in the embodiments of the present disclosure, the drawings used in the description to the embodiments or the prior art will be briefly described below. It is obvious that the drawings in the following description are just for some embodiments of the present disclosure, those skilled in the art can also obtain other drawings based on these drawings without paying any creative effort.

DESCRIPTION OF THE EMBODIMENTS

The technical solutions in the embodiments of the present application will be clearly and completely described in the following with reference to the accompanying drawings in the embodiments of the present application. It is obvious that the described embodiments are a part of the embodiments of the present application, but not all embodiments. All other embodiments obtained by a person of ordinary skill in the art based on the embodiments of the present application without creative efforts are within the scope of the present application.

It should be understood that, when used in this specification and the appended claims, the terms "including" and "comprising" are used to indicate the presence of the described features, entirety, the steps, the operation, the elements and/or components, but do not exclude the presence or addition of one or more other features, entirety, steps, operations, elements, components and/or its collection.

It should be also understood that the terms used in the present application is only for the purpose of describing particular embodiments and is not intended to limit the application. As used in the description and the appended claims of the application, the singular forms "a", "an" and "the" are intended to include the plural unless the context clearly indicates otherwise.

It should be further understood that the term "and/or" used in the description and the appended claims of the application means one or more any combination and all possible combinations of the associated listed items and includes these combinations.

As shown in a specific embodiment shown in FIG. 1 to FIG. 17, the control circuit for the smart lock provided in this embodiment may be used in the state detection and control process of the smart lock, and may even be used in the dead bolt lock, which can be not only applied to the state detection and control of the ordinary smart lock, but is suitable for the state detection and control of the dead bolt lock as well, and has strong applicability.

Figure 1:
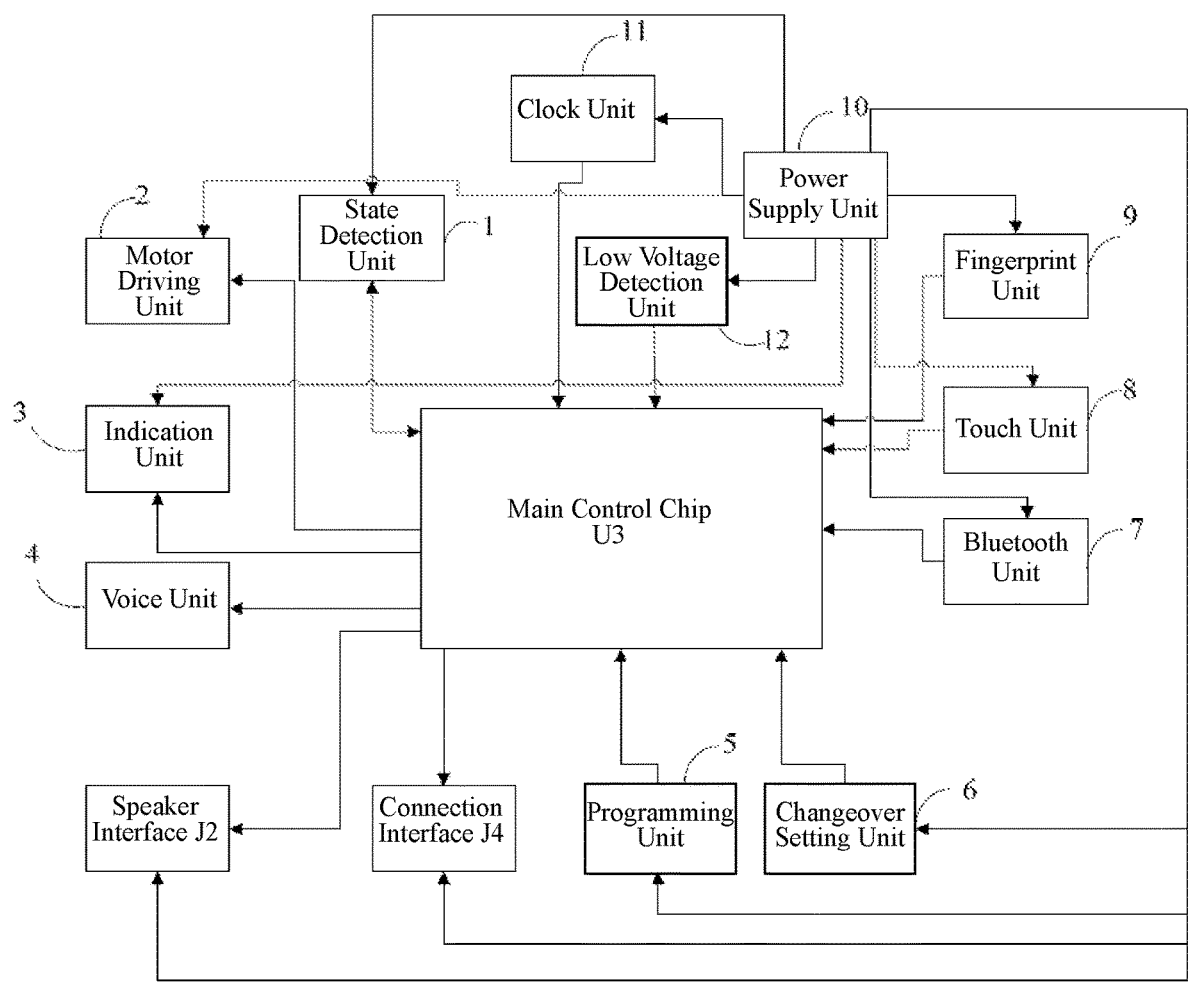
FIG. 1 is a schematic block diagram of a control circuit for a smart lock according to an embodiment of the present application.
Figure 2:
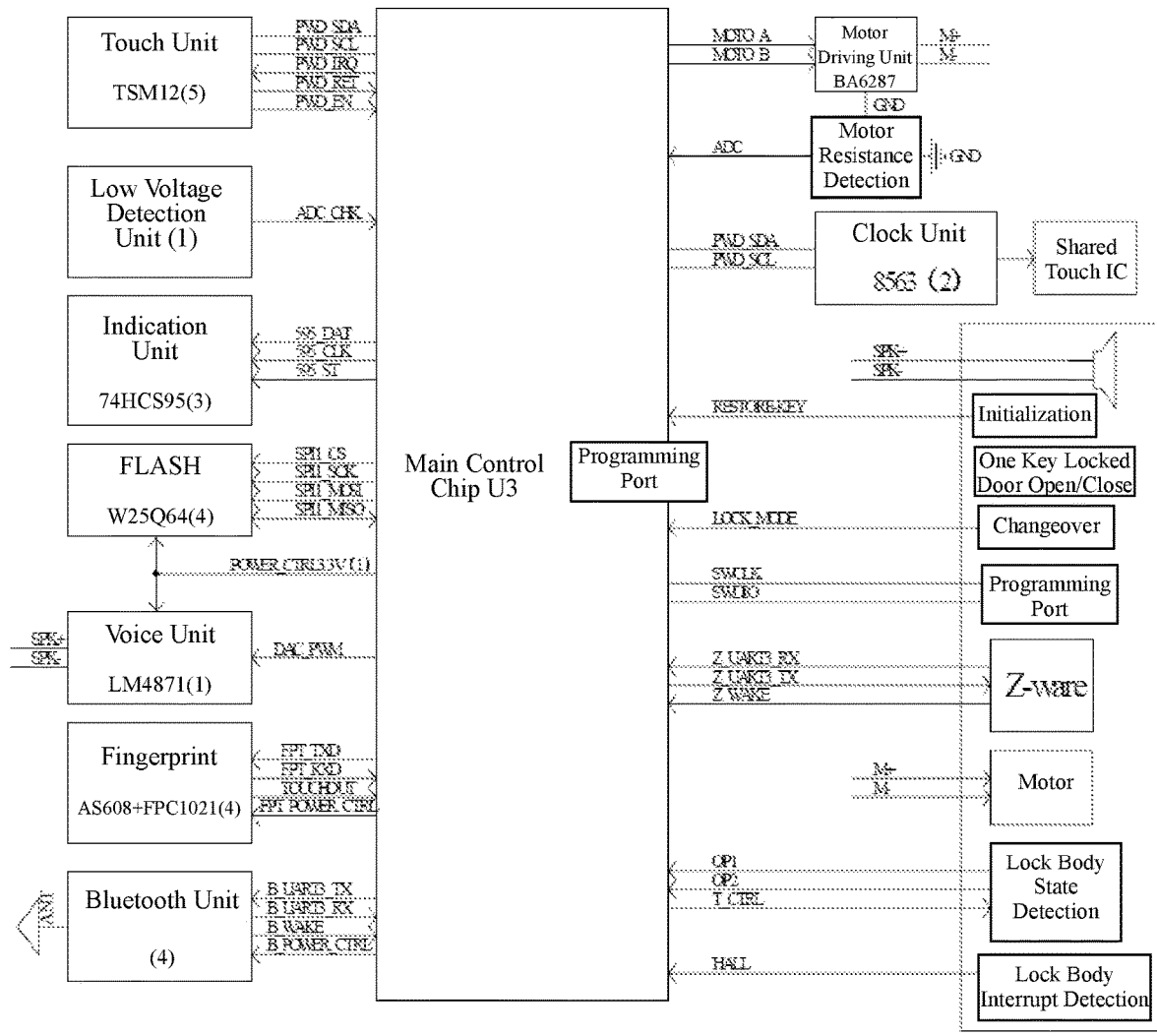
FIG. 2 is a schematic block diagram of connection of a control circuit for a smart lock according to an embodiment of the present application.
Figure 4:
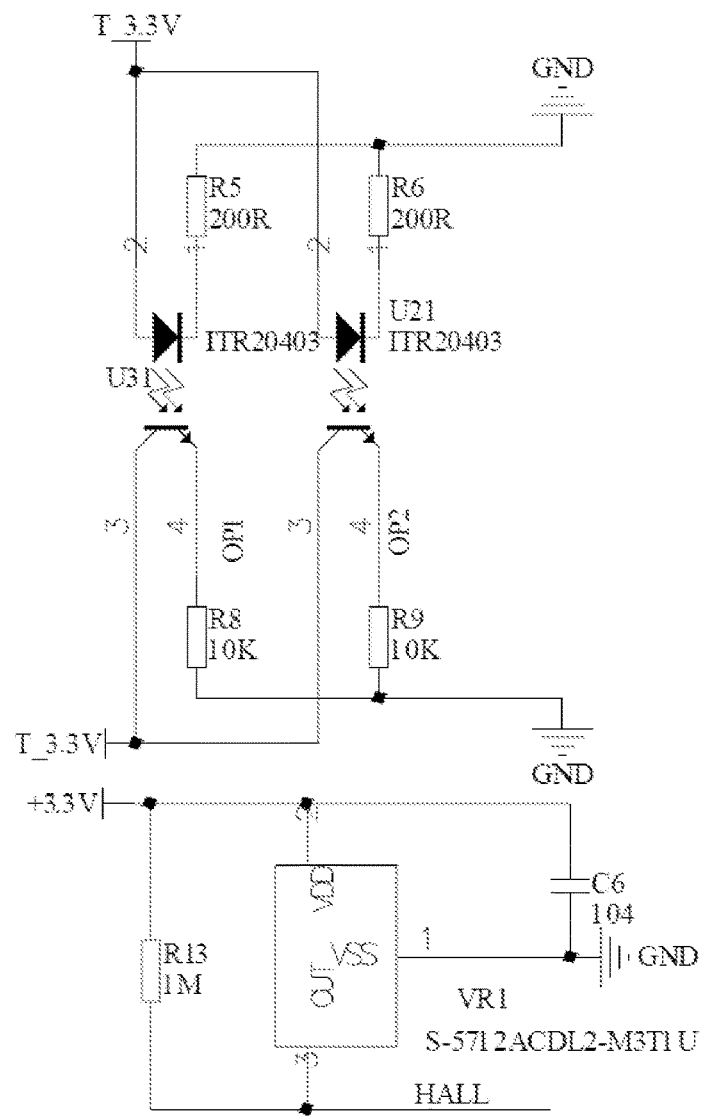
FIG. 4 is a schematic circuit diagram of a state detection unit according to an embodiment of the present application.
Figure 4:
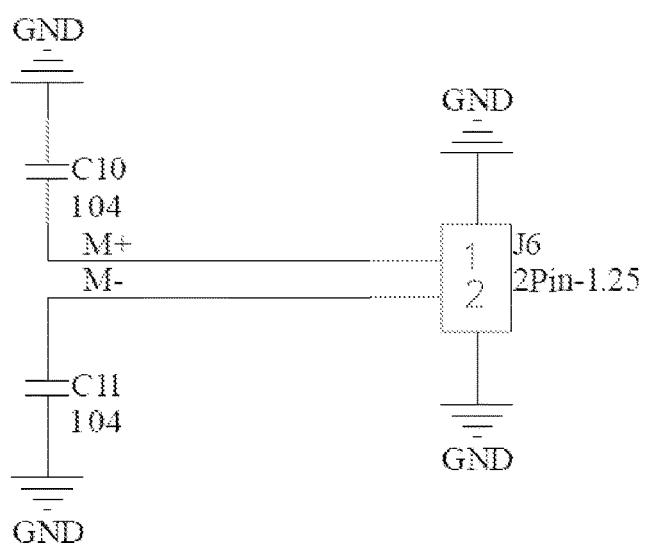

Please refer to FIGS. 1, 2 and 4, FIG. 1 is a schematic block diagram of a control circuit for a smart lock according to an embodiment of the present application. The control circuit for the smart lock includes a state detection unit 1, a main control chip U3, and a motor driving unit 2; the state detection unit 1 includes optocoupler sensors U21, U31 and a Hall sensor VR1, the optocoupler sensors U21, U31 and the Hall sensor VR1 are respectively disposed in the lock body of the smart lock; the optocoupler sensor U21 is configured to detect whether the state of the lock body is locked in position and the motor is retracted in position so as to form a first in-position signal; the optocoupler sensor U31 is configured to detect whether the state of the lock body is unlocked in position and the motor is retracted in position so as to form a second in-position signal; the Hall sensor VR1 is configured to detect whether the state of the lock body is unlocked in position so as to form an auxiliary signal; the main control chip U3 is configured to output a control signal according to the first in-position signal, the second in-position signal and the auxiliary signal; the motor driving unit 2 is configured to be connected to the motor and to drive the motor to rotate forward or reverse or stop rotating according to the control signal.

In the dead bolt lock, the touch switch cannot be used to detect the lock and unlock state. Therefore, the optocoupler sensors U21 and U31 and the Hall sensor VR1 are used for detecting the lock and unlock state, and the applicability is strong.

Figure 3:
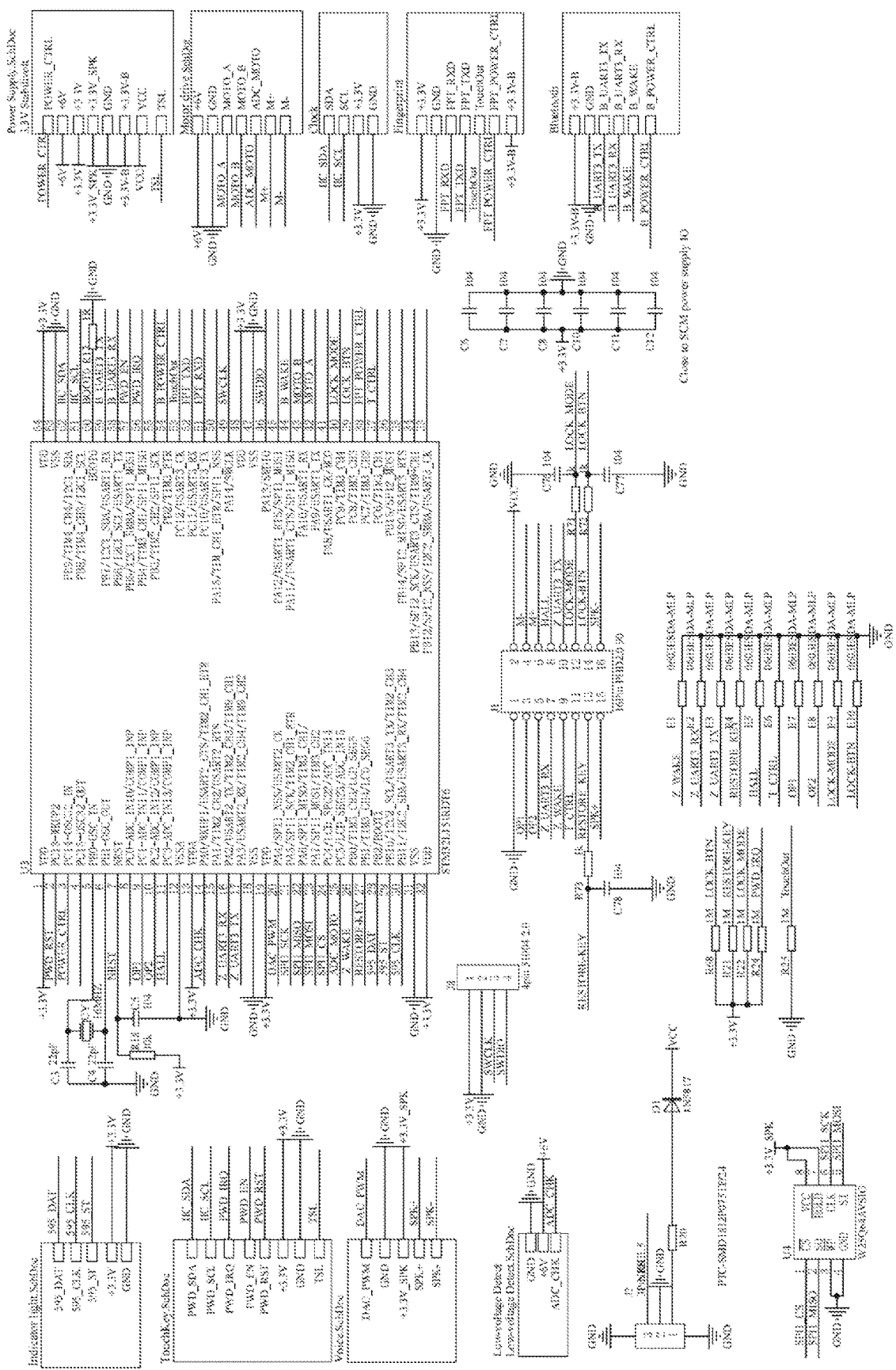
FIG. 3 is a schematic circuit diagram of a main control chip U3 according to an embodiment of the present application.

In this embodiment, as shown in FIG. 3, the model of the main control chip U3 includes but is not limited to STM32L151RDT6, and the pins of the main control chip U3 is also connected with an interface J1 for being connected to all units of the control circuit. In addition, the pins of the main control chip U3 is also connected with a memory chip U4 connected to the power supply unit 10. The model of the memory chip U4 includes but is not limited to W25Q64AVSIG, and the memory chip U4 is used for storing voice content.

Figure 6:
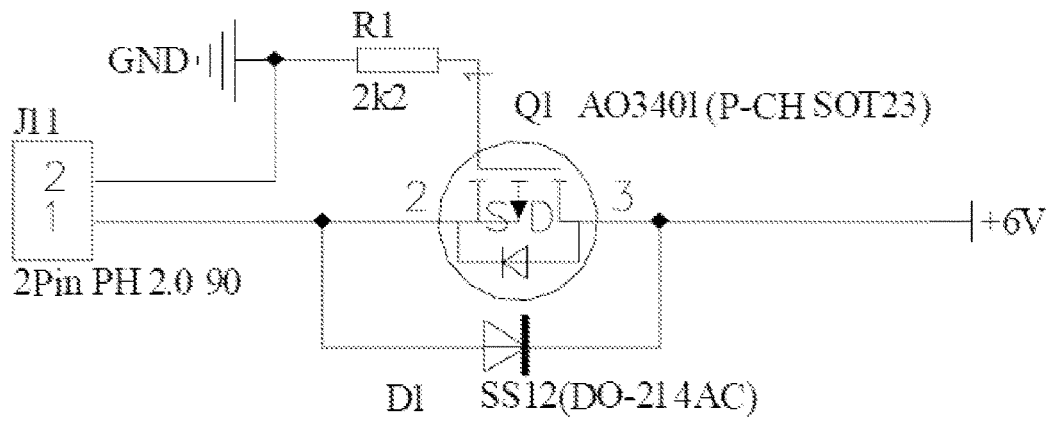
FIG. 6 is a schematic circuit diagram of a lock body power supply control element Q21 according to an embodiment of the present application.
Figure 6:
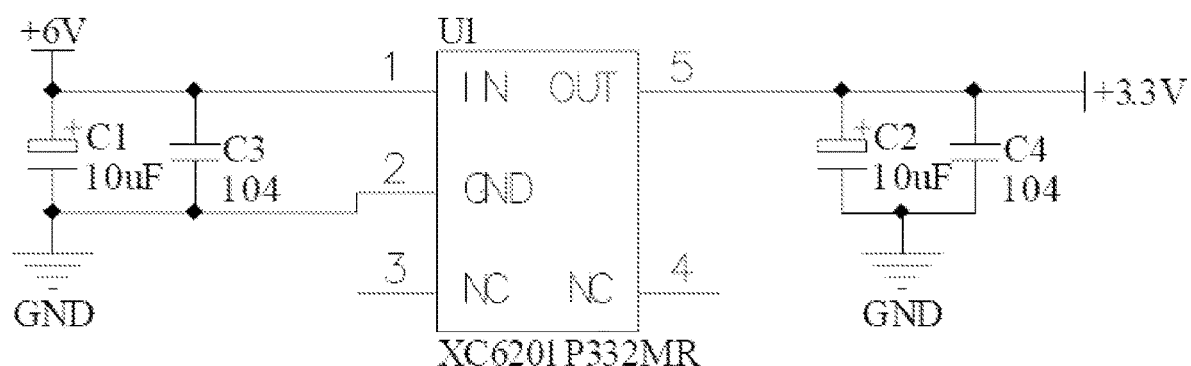
Figure 6:
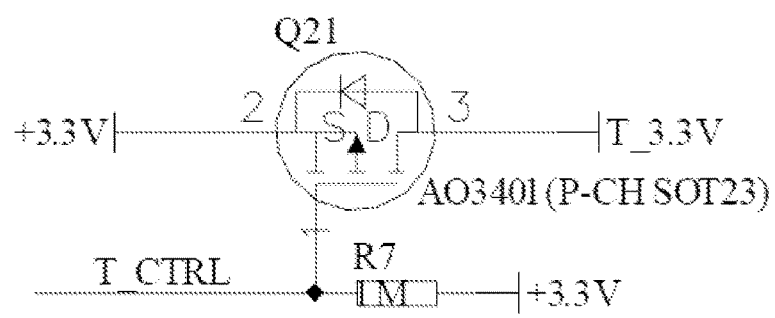

In an embodiment, as shown in FIG. 6, the above control circuit further includes a lock body power supply control element Q21, and the lock body power supply control element Q21 is turned on or off according to the control signal so as to energize or de-energize the lock body. After the lock switch operation is performed, the input of the lock body power supply is turned off to achieve the purpose of reducing power consumption.

Specifically, the lock body power supply control element Q21 is a MOSFET Q21, the gate of the lock body power supply control element Q21 is connected to the main control chip U3, and the source of the lock body power supply control element Q21 is connected with a power management chip U1, a pin of the management chip U1 is connected with a switching element Q1, and the switching element Q1 is connected to the interface J11 provided for connection with an external 6V power supply. The source and the gate of the switching element Q1 are also connected in parallel with a diode D1, the external 6V power supply is converted to a +3.3V supplying to the lock body. After automatic locking in position and automatic unlocking in position, the lock body power supply control element Q21 is turned off to stop supplying power to the lock body and reduce power consumption.

Figure 5:
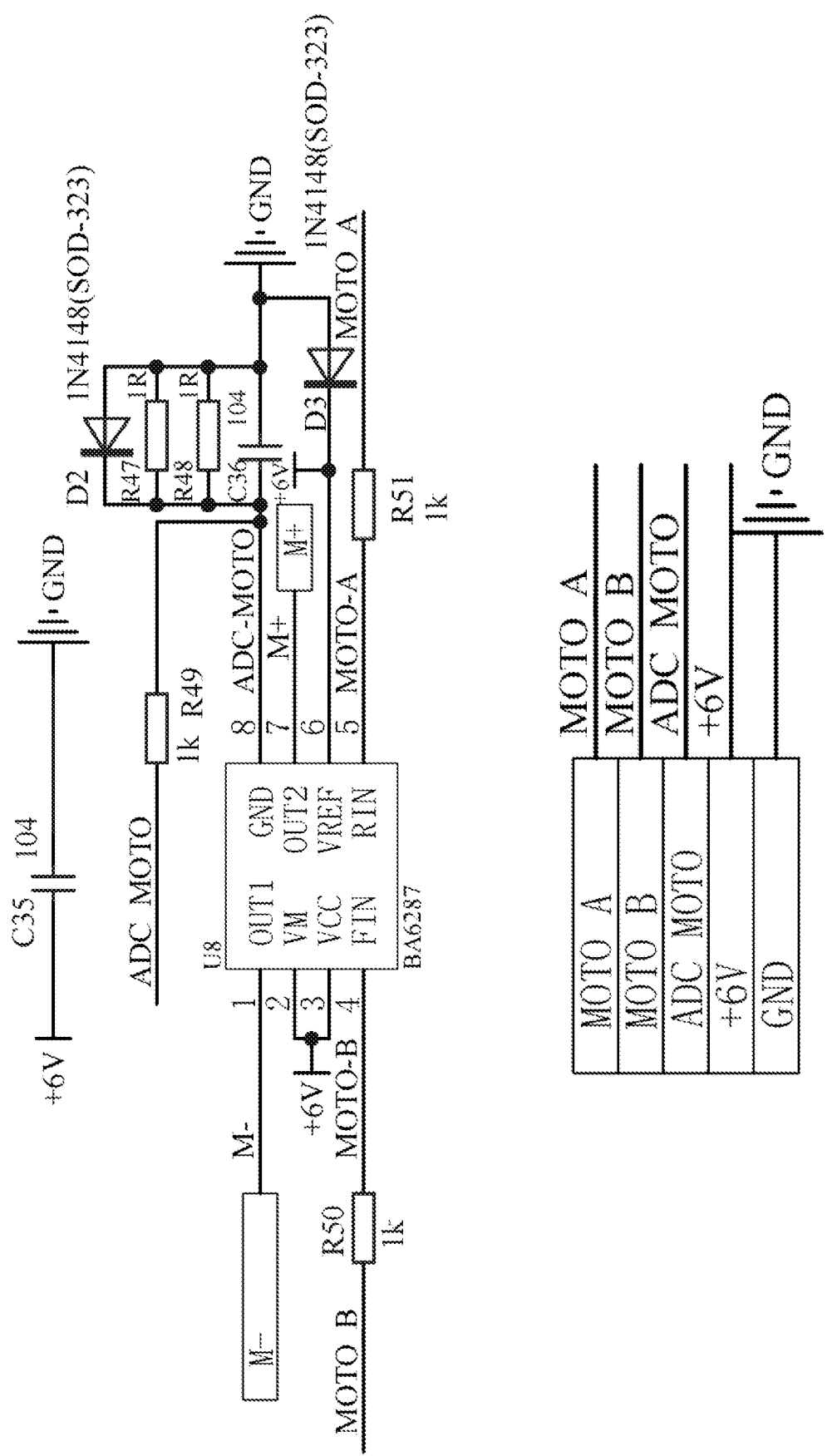
FIG. 5 is a schematic circuit diagram of a motor driving unit according to an embodiment of the present application.

In an embodiment, as shown in FIG. 5, the motor driving unit 2 includes a motor drive chip U8, and the motor drive chip U8 is connected to the main control chip U3 through the voltage stabilizing resistors R50, R51. The motor drive chip U8 is also connected to the main control chip U3 through the detecting resistor R49.

In addition, the pin GND of the motor driver chip U8 is connected to the pin VREF of the motor driver chip U8 through the filter capacitor C36 and the Zener diode D3, the filter capacitor C36 is further connected with resistors R47, R48 and diode D2 in parallel, and the pin GND is connected with the main control chip U3 through the resistor R49 to realize overcurrent detection of the motor.

In this embodiment, the model of the motor drive chip U8 described above includes, but is not limited to, BA6287. The motor drive chip U8 is powered by a +6V voltage.

Figure 7:
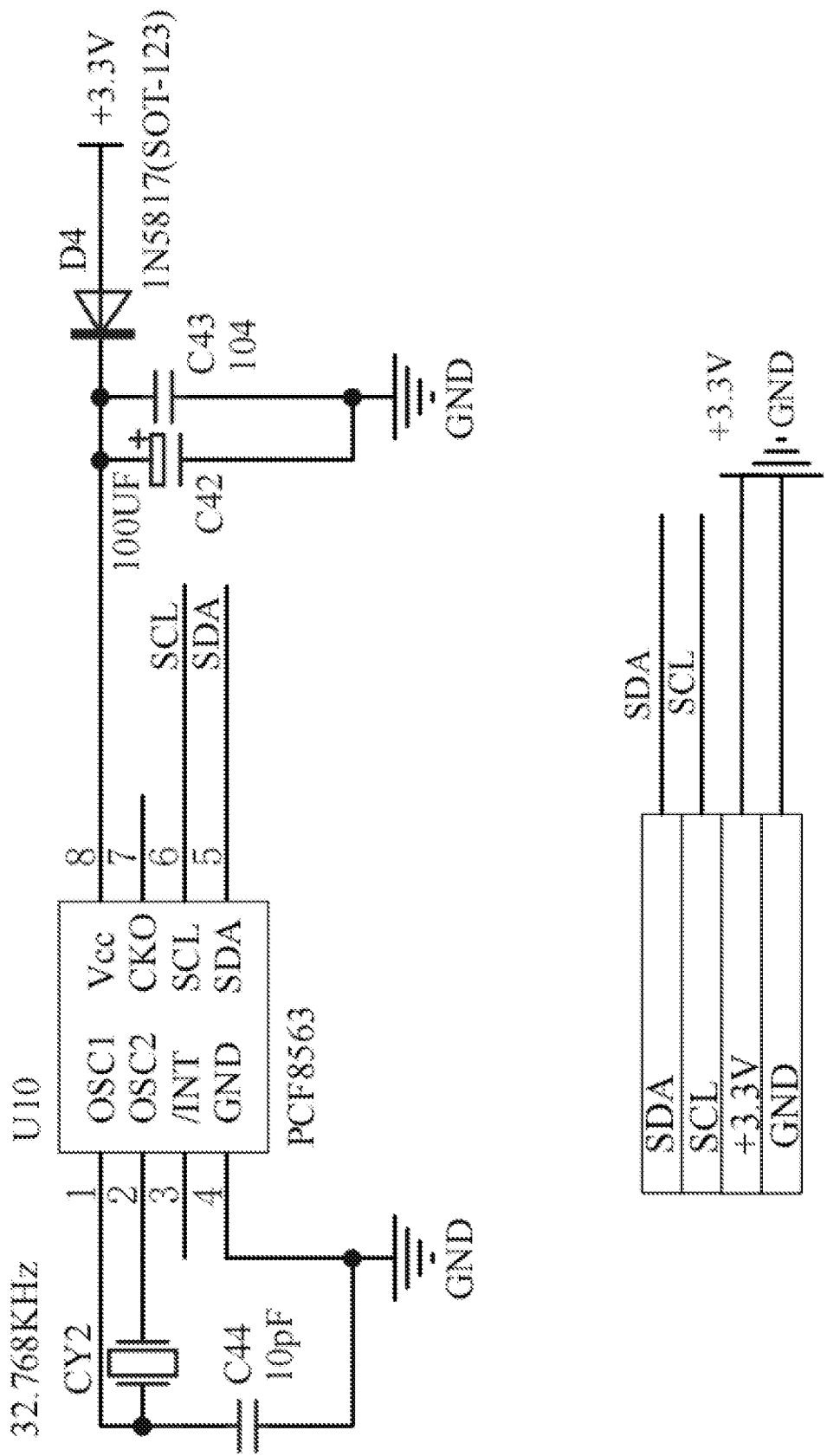
FIG. 7 is a schematic circuit diagram of a clock unit according to an embodiment of the present application.

In an embodiment, as shown in FIG. 7, the control circuit further includes a clock unit 11 connected to the main control chip U3. The clock unit 11 includes a clock chip U10, and a terminal of the clock chip U10 is further connected to the oscillator CY2 and the filter capacitor C44, where the model of the clock chip U10 includes but is not limited to PCF8563. In addition, the anti-reverse diode D4 and the filter capacitor C43 grounded at one end are connected between the clock chip U10 and the power supply unit 10. The operating voltage of the clock chip U10 is +3.3V, and the clock unit 11 can provide a clock function for the entire control circuit, so that the entire control process is more precise in time control.

Figure 8:
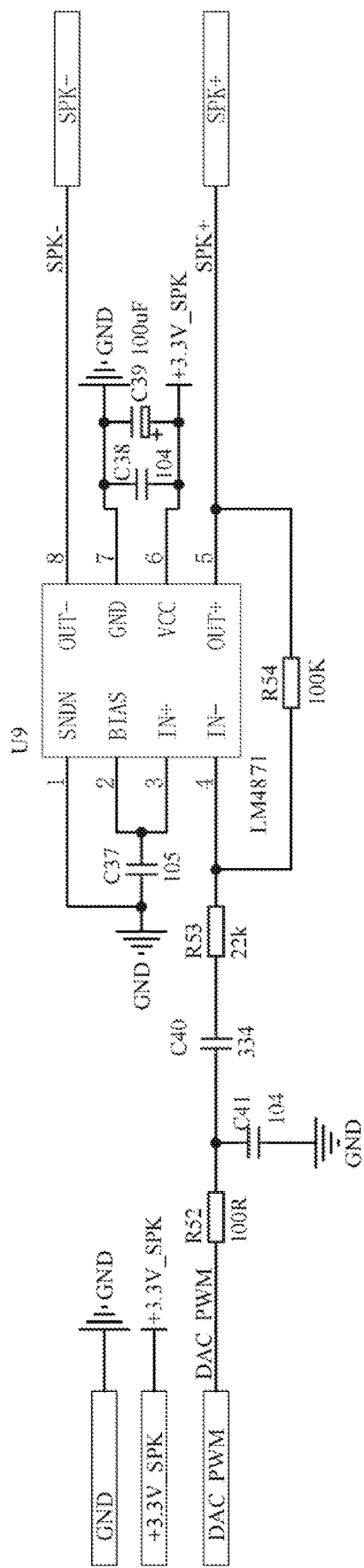
FIG. 8 is a schematic circuit diagram of a voice unit according to an embodiment of the present application.

In an embodiment, as shown in FIG. 8, the control circuit further includes a voice unit 4 connected to the main control chip U3. The voice unit 4 includes a voice chip U9, and the voltage stabilizer resistors R52 and R53 and a filter capacitor C41 grounded at one end are connected between the voice chip U9 and the main control chip U3. The main control chip U3 outputs a voice signal, drives the voice chip U9 to play the voice, and uses the voltage stabilizing resistors R52 and R53 and the filter capacitor C41 grounded at one end to regulate and filter the voice signal, so that the voice playing is more stable.

In this embodiment, the model of the voice chip U9 includes but is not limited to LM4871, where the pin IN− and the pin OUT+ of the voice chip U9 are connected to each other through a resistor R45, and the pin GND and the pin VCC are connected to each other through capacitors C38 and C39, and the voice chip U9 is powered by a voltage of +3.3V.

Figure 9:
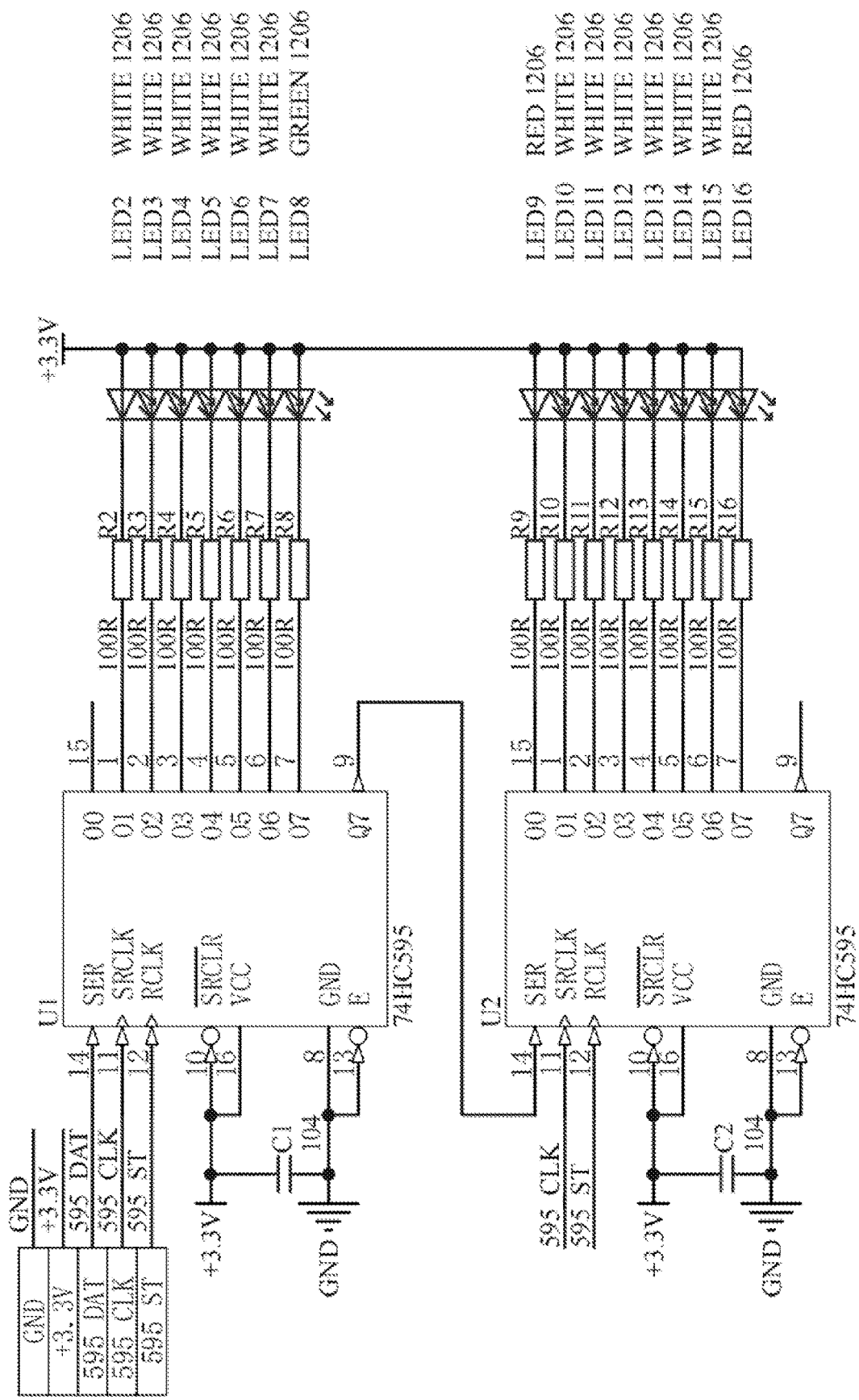
FIG. 9 is a schematic circuit diagram of an indication unit according to an embodiment of the present application.

In an embodiment, as shown in FIG. 9, the control circuit described above further includes the indication unit 3 connected to the main control chip U3. The indication unit 3 includes the indicator light drive chips U18 and U19, and the pins of the indicator light drive chips U18, U2 are respectively connected with indicator lights. Specifically, the pins of the indicator light drive chip U18 are connected with the indicator lights LED2~LED8, and the pins of the indicator light drive chip U19 are connected with the indicator lights LED9~LED16.

The pins of the indicator light drive chip U18 are respectively connected with the indicator lights LED2~LED8 through the current-limiting resistors R2-R8; the indicator light drive chip U19 are respectively connected with the indicator light LED9~LED16 through the current-limiting resistor R9~R16. The indicator lights LED2~LED16 are used for light indication.

In this embodiment, the models of the indicator light drive chips U18, U2 described above include, but are not limited to, 74HC595.

In an embodiment, the control circuit further includes a fingerprint unit 9, a touch unit 8, and a Bluetooth unit 7 respectively connected to the main control chip U3.

Figure 10:
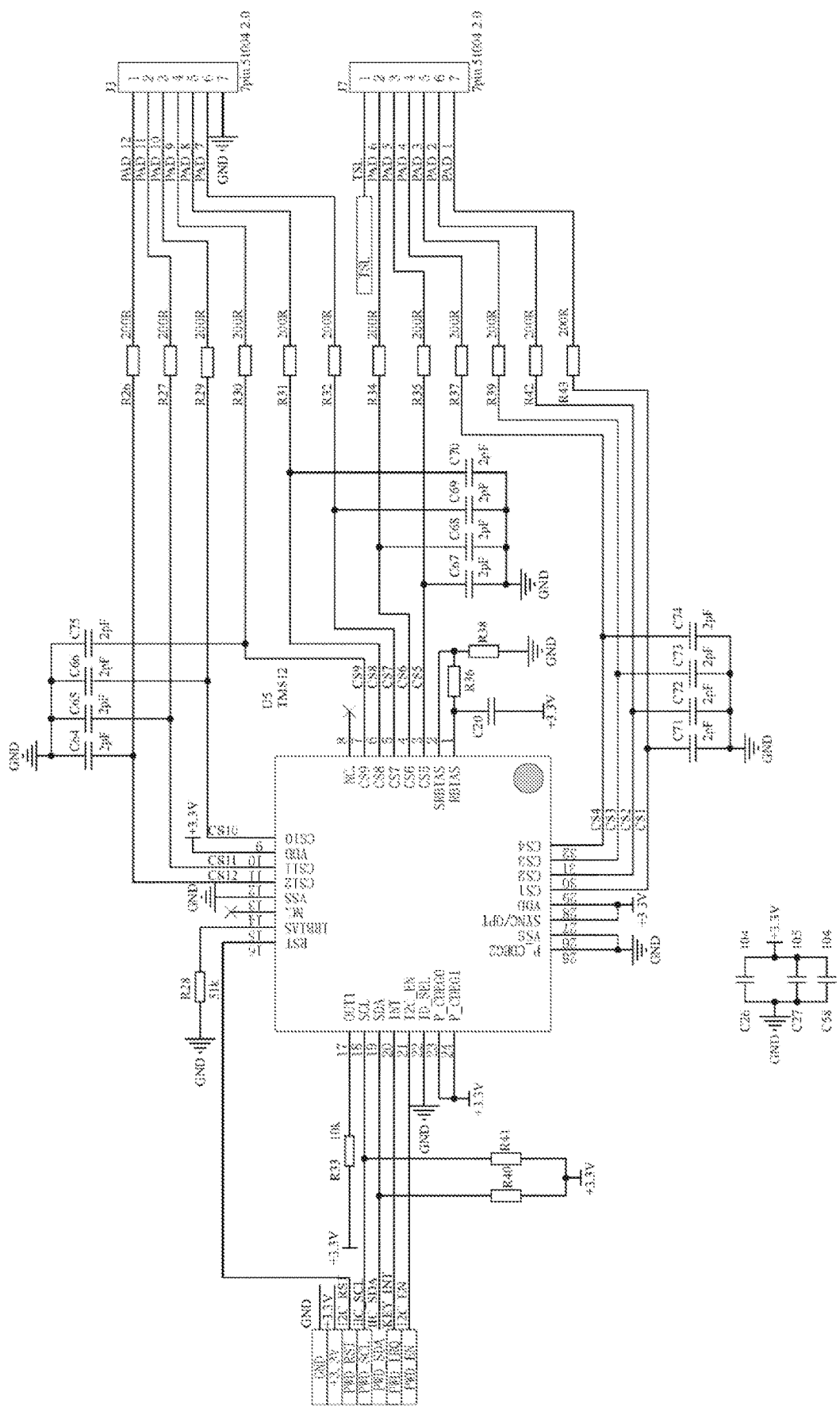
FIG. 10 is a schematic circuit diagram of a touch unit according to an embodiment of the present application.

Specifically, as shown in FIG. 10, the touch unit includes the touch chip U5. In this embodiment, the model of the touch chip U5 includes but is not limited to TMS12. Specifically, the pins of the touch chip U5 are connected to the interfaces J3 and J7.

The resistors R26, R27, R29, R30, R31 and R32 are connected between the touch chip U and the interface J3, and the resistors R34, R35, R37, R39, R42, and R43 are connected between the touch chip U and the interface J7. The interface J3 and J7 may be used to be connected to the numeric keypad which can be used to enter the password to achieve the purpose of unlocking by password.

Figure 19:
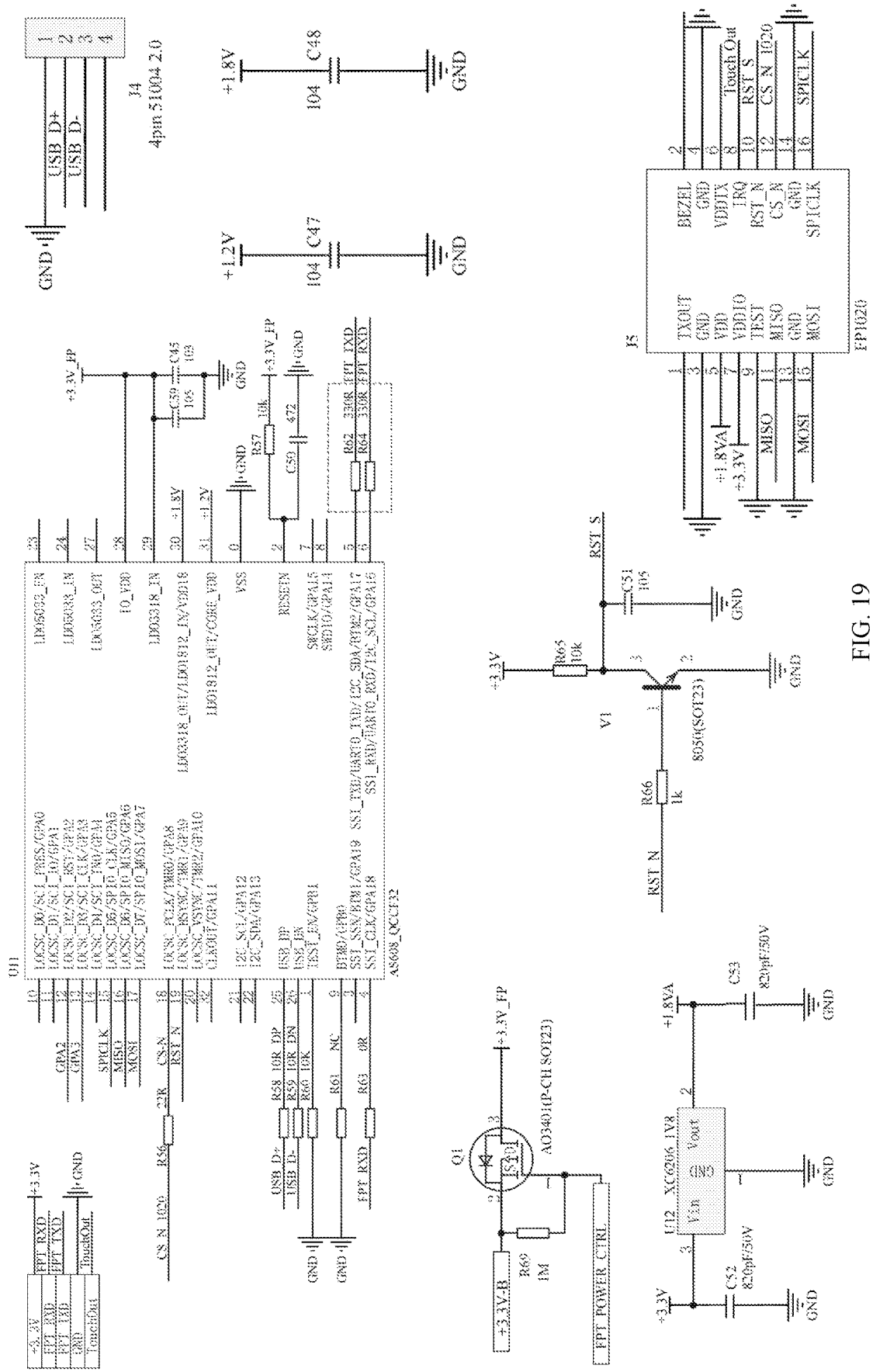
FIG. 19 is a schematic circuit diagram of a fingerprint unit according to an embodiment of the present application.

As shown in FIG. 19, the fingerprint unit 9 includes a fingerprint chip U11 and a fingerprint sensor J5. The fingerprint chip U11 is connected to the main control chip U3. The fingerprint sensor J5 is connected to the fingerprint chip U11, and the fingerprint sensor J5 and the fingerprint chip U11 are used together to obtain fingerprint information which is transmitted to the main control chip U3. In addition, the MOSFET Q1 is connected between the fingerprint sensor J5 and the power supply unit 10, and the fingerprint chip U1 drives the MOSFET Q1 to be turned on or off to reduce the power consumption when the fingerprint unit 9 is not in operation. In addition, the MOSFET Q1 is connected with the power management chip U12, the power management chip U12 is connected with the fingerprint sensor J5, converts the voltage of +3.3V into the voltage of +1.8V, and supplies the voltage of +1.8V to the fingerprint sensor J5.

In addition, a transistor V1 is further connected between the fingerprint chip U11 and the power supply unit 10 to reset the fingerprint sensor. Specifically, the collector of the transistor V1 and the power supply unit 10 are connected to each other through a resistor R65, the emitter of the transistor V1 is grounded, and the base of the transistor V1 is connected to the fingerprint chip U11 through a resistor R66. The pins of the fingerprint chip U1 are also connected with interface J4 for being connected to the fingerprint sensor.

In this embodiment, the model of the fingerprint chip U11 described above includes but is not limited to AS608_QCCF32.

Figure 18:
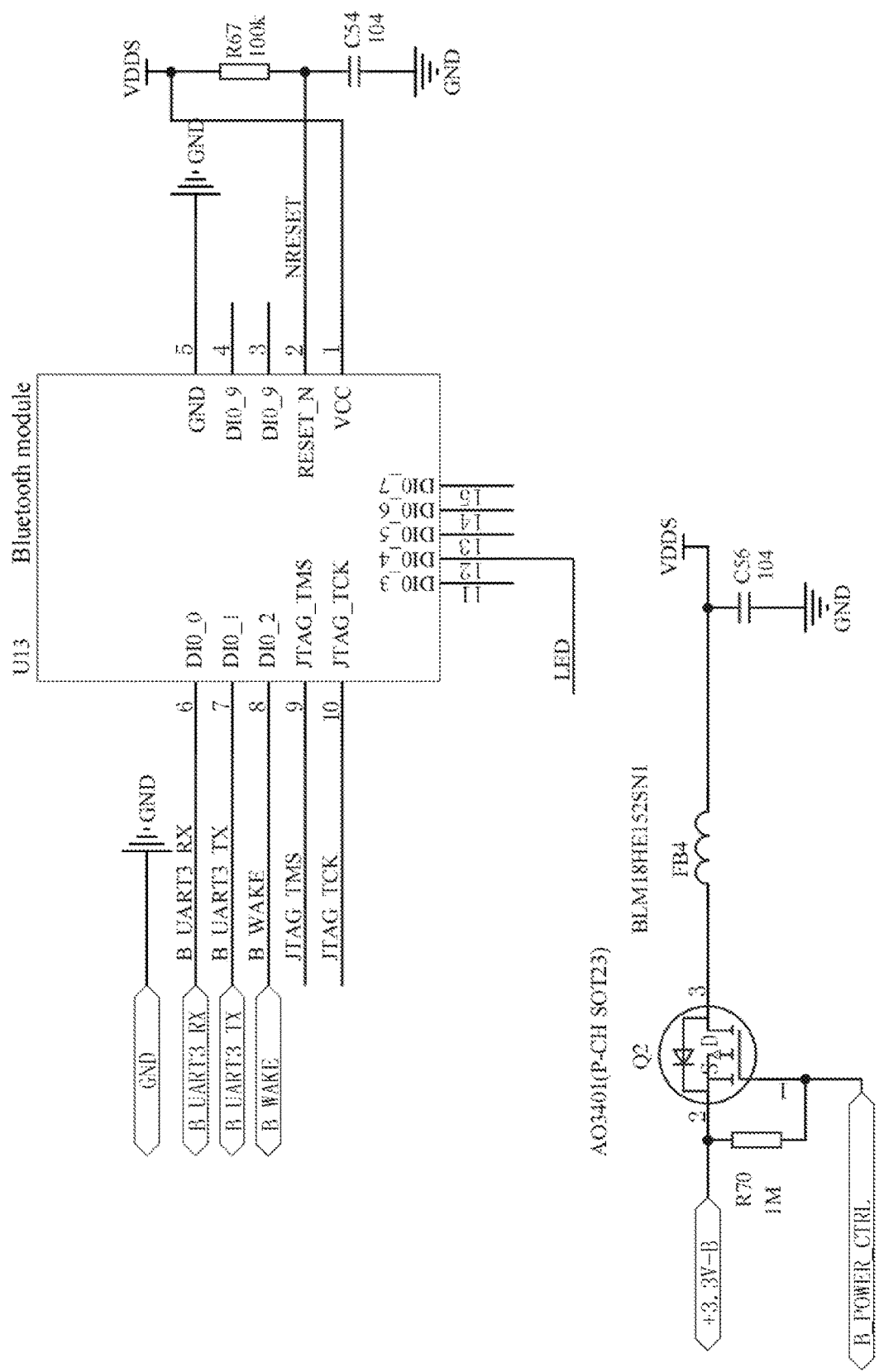
FIG. 18 is a schematic circuit diagram of a Bluetooth unit according to an embodiment of the present application.

As shown in FIG. 18, the Bluetooth unit 7 includes a Bluetooth chip U13. The pin of the Bluetooth chip U13 is connected to the power supply unit 10 through the MOSFET Q21. The Bluetooth chip U13 may be used to perform the remote controlled locking and unlocking.

Figure 11:
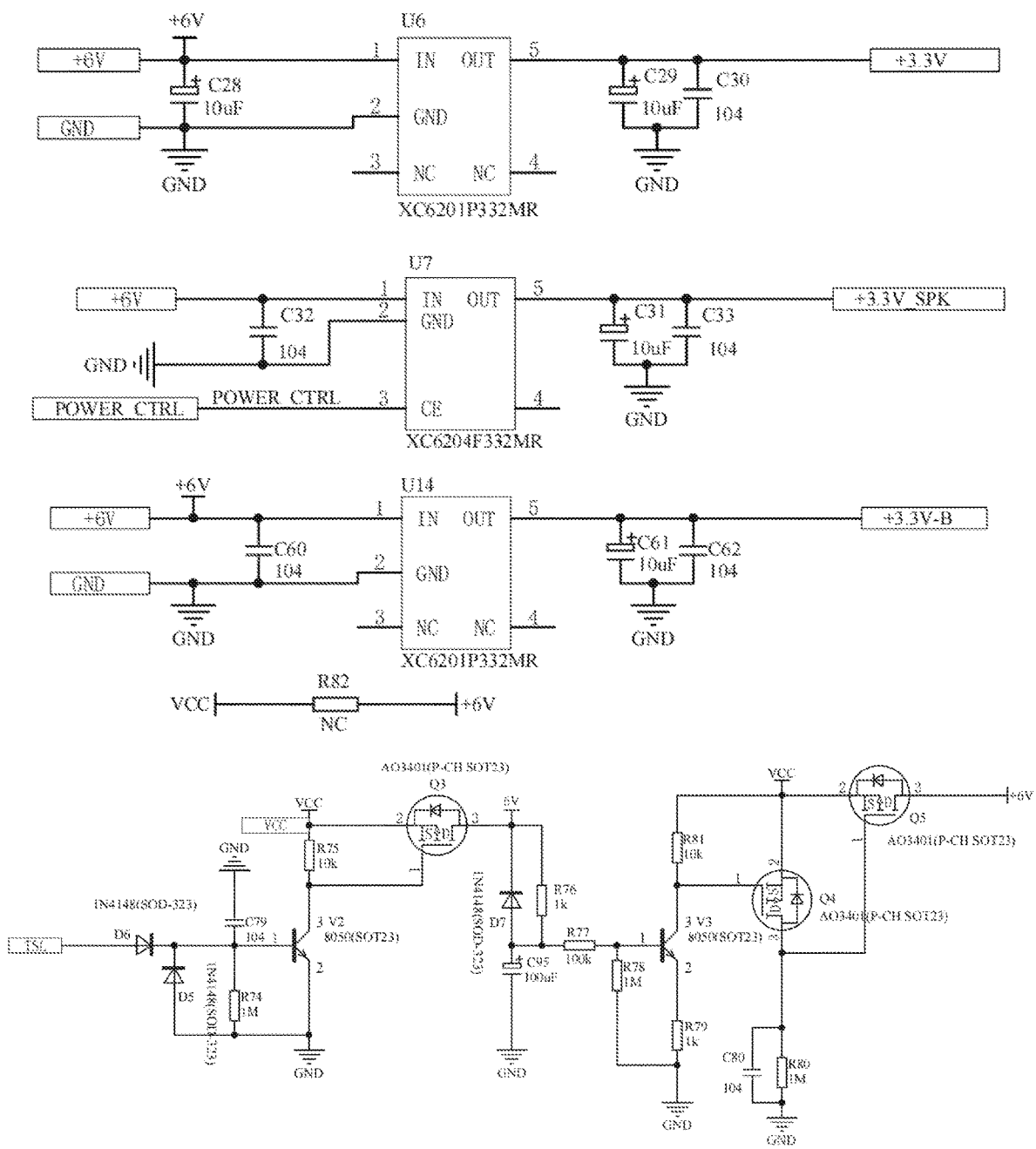
FIG. 11 is a schematic circuit diagram of a power supply unit according to an embodiment of the present application.

In an embodiment, as shown in FIG. 11, the control circuit further includes a power supply unit 10, the power supply unit 10 includes power management chips U6, U7, and U14, and the power management chips U6, U7, and U14 are respectively connected with a voltage stabilizing module, the power management chip U6 is respectively connected to the indication unit 3, the touch unit 8, the clock unit 11, and the lock body power supply control element Q21, the power management chip U7 is connected to the voice unit 4, and the power management chip U14 is connected to the Bluetooth unit 7.

In this embodiment, the model of the power management chips U6, U7, and U14 described above includes, but is not limited to, XC6204F332MR.

In addition, the above-mentioned voltage stabilizing module includes MOSFET Q5, Q4, a transistor V3, a MOSFET Q3 and a transistor V2, where the MOSFET Q5 is connected to the MOSFET Q4, the MOSFET Q4 is connected to the transistor V3, the transistor V3 is connected to the MOSFET Q3, the MOSFET Q3 is connected to the transistor V2, and the transistor V2 is connected to the power management chips U6, U7, U14, respectively, and the voltage of +6V is regulated to form a voltage of +3.3V.

The gate of the MOSFET Q5 and the gate of the MOSFET Q4 are respectively grounded through the resistor R80 and the capacitor C80. The source of the MOSFET Q5 is connected to the collector of the transistor V3 through the resistor R81, and the base of the transistor V3 is grounded through the resistor R78, the emitter of the transistor V3 is grounded through the resistor R79. In addition, the drain of the MOSFET Q3 is connected to the base of the transistor V3 through the resistors R76 and R77, and the drain of the MOSFET Q3 is grounded through the Zener diode D7 and the filter capacitor C95. The source of the MOSFET Q3 is connected to the collector of the transistor V2, the emitter of the transistor V2 is grounded, and the base of the transistor V2 is connected to the power management chips U6, U7, U14 through the anti-reverse diode D6, respectively. Specifically 6, the emitter and the base of the transistor V2 are connected to each other through the resistor R74 and the Zener diode D5.

Figure 12:
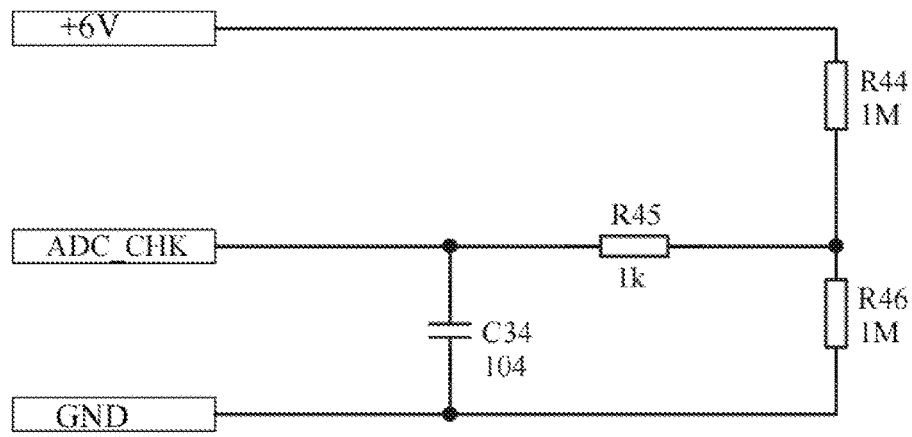
FIG. 12 is a schematic circuit diagram of a low voltage detection unit according to an embodiment of the present application.

In an embodiment, as shown in FIG. 12, the control circuit further includes a low voltage detection unit 12 connected to the main control chip U3, the low voltage detection unit 12 includes the detecting resistors R44 R45, R46 and the capacitor C34 connected to the power unit 10, and the capacitor C34 and the resistor R45 are respectively connected to the main control chip U3. By performing low voltage detection, inoperation of the lock body due to low voltage can be avoided.

Figure 13:
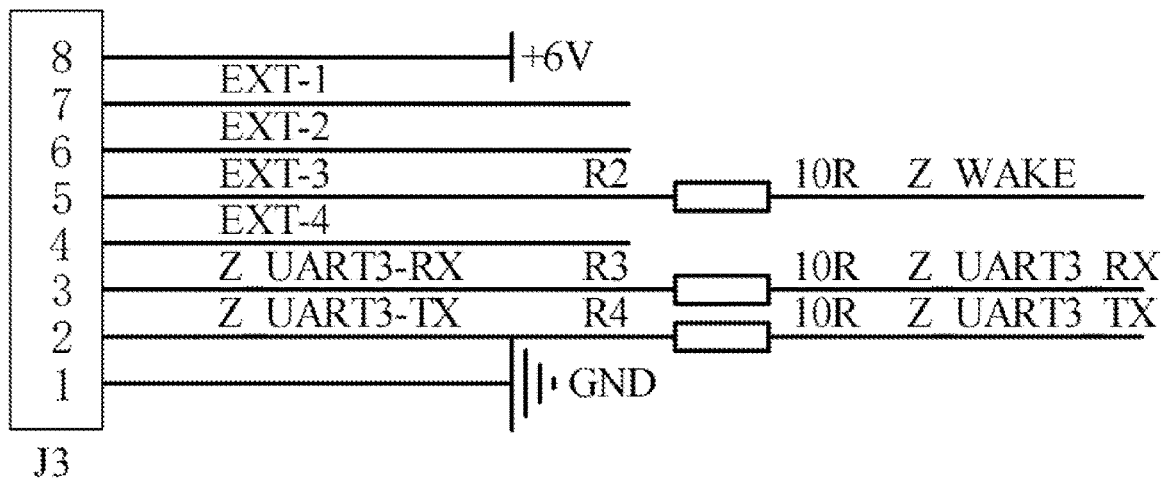
FIG. 13 is a schematic circuit diagram of an extension unit according to an embodiment of the present application.

In an embodiment, as shown in FIG. 13, the control circuit further includes an extension unit connected to the main control chip U3, and the extension unit includes an extension interface J3 for being connected to other extension modules to increase the function of the lock body.

Figure 14:
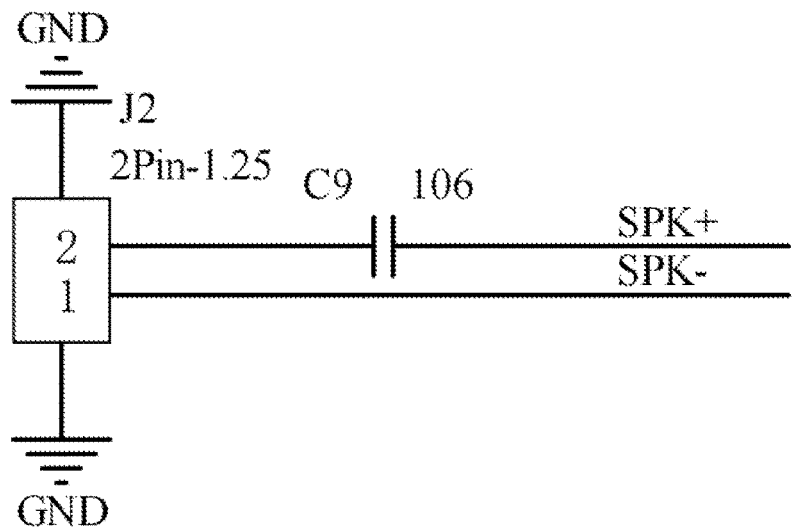
FIG. 14 is a schematic circuit diagram of a speaker interface according to an embodiment of the present application.

In an embodiment, as shown in FIG. 14, the control circuit further includes a speaker interface J2 connected to the main control chip U3.

Figure 15:
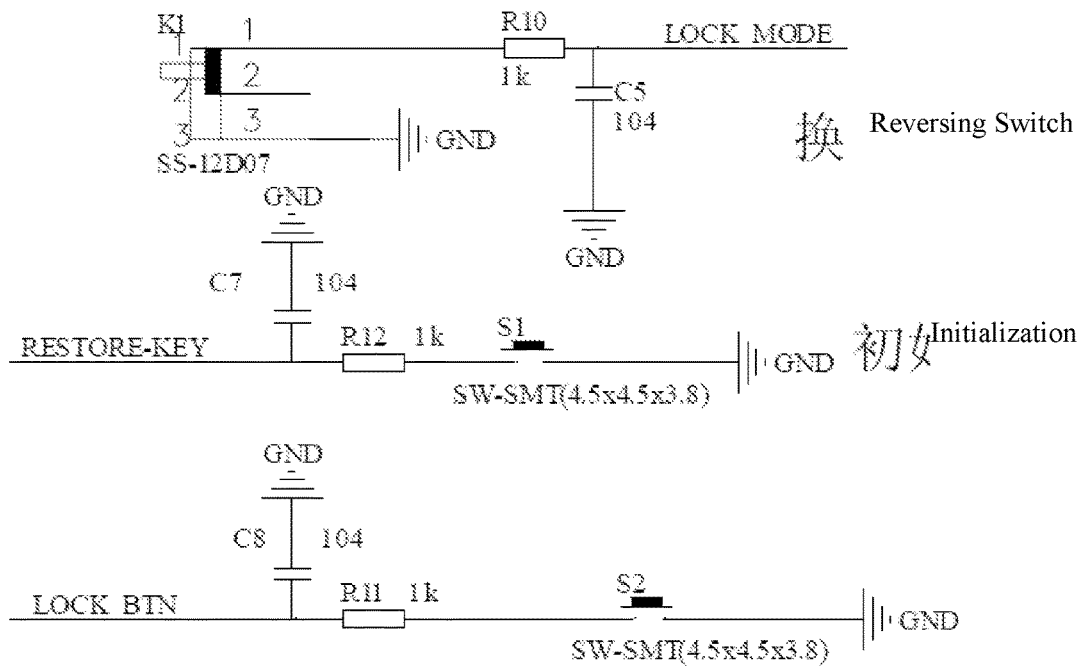
FIG. 15 is a schematic diagram of a specific circuit of a changeover setting unit according to an embodiment of the present application.

In an embodiment, as shown in FIG. 15, the control circuit further includes a changeover setting unit 6 connected to the main control chip U3, the changeover setting unit 6 includes a reversing switch K1, and a resistor R10 and a filter capacitor C5 grounded at one end are further connected between the reversing switch K1 and the main control ship U3. The control circuit further includes an initialization key S1 connected to the main control chip U3 for initializing the state of the lock body; the control circuit also includes a locking key S2 for driving the lock body to lock.

Figure 16:
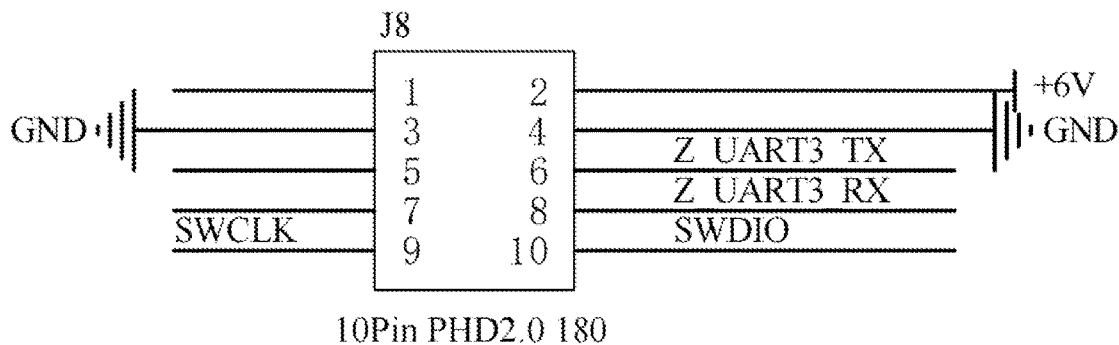
FIG. 16 is a schematic circuit diagram of a programming unit according to an embodiment of the present application.

In an embodiment, as shown in FIG. 16, the control circuit further includes a programming unit 5 connected to the main control chip U3, and the programming unit 5 includes a programming interface J8 for programming.

Figure 17:
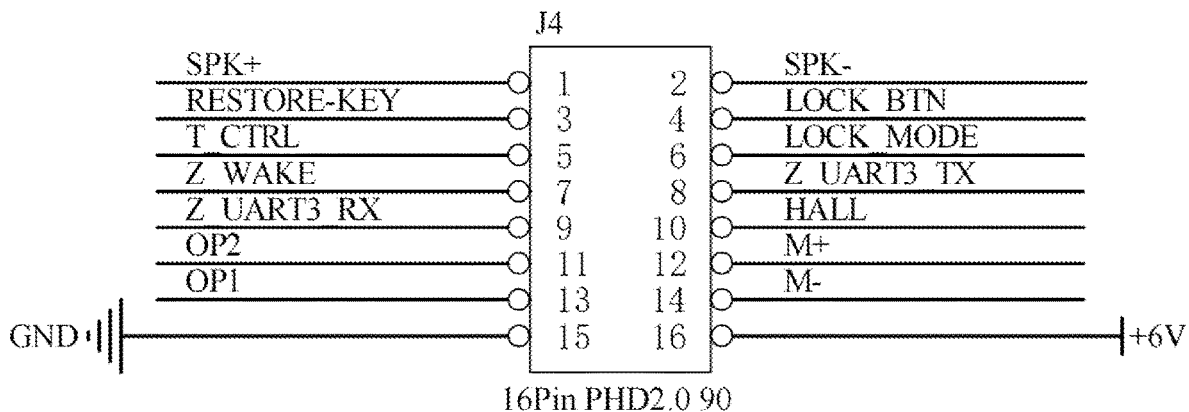
FIG. 17 is a schematic circuit diagram of a connection interface J4 according to an embodiment of the present application.

In an embodiment, as shown in FIG. 17, the above control circuit further includes a connection interface J4 for being connected to the front circuit board and the rear circuit board located in the lock body.

The smart lock includes a housing, a lock body disposed outside the housing, a motor and a clutch mechanism disposed inside the housing; the clutch mechanism includes a driven gear and a rotating wheel which are coaxially arranged, a driving gear that meshes with the driven gear is disposed on the output shaft of the motor, a first surface of the driven gear is provided with a mounting position for inserting the rotating wheel, and a side wall of the mounting position is provided with a curved recess, and the outer side wall of the rotating wheel is provided with a curved convex block corresponding to the curved recess, where the central angle corresponding to the curved recess is denoted as α, the central corner corresponding to the curved convex block is denoted as β, and α and β satisfy: α-β≤180°; the first surface of the driven gear is provided with a first baffle and a second baffle symmetrically arranged with respect to the center line of the curved recess, and a line connecting the first baffle and the second baffle passes through an axis of the driven gear; a magnetic column is disposed on the rotating wheel, the magnetic column is located at a center line of the curved convex block; a circuit board electrically connected to the motor is disposed in the housing, and the circuit board is provided with a first sensor and a second sensor for detecting the first baffle and the second baffle and a third sensor for detecting the magnetic column.

When the changeover switch K1 is switched to the mode of closing door by rotating counterclockwise, when locking, the main control chip U3 of the lock body sends a closing door command to the motor drive chip U8, and the motor drive chip U8 drives the motor to rotate clockwise, when the optocoupler sensor U21 detects the second baffle of the lock body, it means the automatic locking in position, and the motor drive chip U8 drives the motor to stop rotating under the control of the main control chip U3, and then a drag-back operation is performed, the motor drive chip U8 drives the motor to rotate counterclockwise, when the optocoupler sensor U21 detects the first baffle of the lock body, the motor drive chip U8 drives the motor to stop rotating under the control of the main control chip U3, and the entire locking operation is completed. The main control chip U3 of the lock sends an opening door command to the motor drive chip U8, and the motor drive chip U8 drives the motor to rotate counterclockwise, when the optocoupler sensor U31 detects the second baffle of the lock body and the Hall sensor VR1 detects the magnetic column, it means the automatic unlocking in position, the motor drive chip U8 drives the motor to stop rotating under the control of the main control chip U3, and then the drag-back operation is performed, the motor drive chip U8 drives the motor to rotate clockwise, when the optocoupler sensor U21 detects the first baffle of the lock body, the motor drive chip U8 drives the motor to stop rotating under the control of the main control chip U3, and the entire unlocking operation is completed.

When the changeover switch K1 is switched to the mode of closing door by rotating clockwise, when locking, the main control chip U3 of the lock body sends a closing door command to the motor drive chip U8, and the motor drive chip U8 drives the motor to rotate counterclockwise, when the optocoupler sensor U21 detects the second baffle of the lock body, it means the automatic locking in position, and the motor drive chip U8 drives the motor to stop rotating under the control of the main control chip U3, and then the drag-back operation is performed, and the motor drive chip U8 drives the motor to rotate clockwise, when the optocoupler sensor U21 detects the first baffle of the lock body, the motor drive chip U8 drives the motor to stop rotating under the control of the main control chip U3, and the entire locking operation is completed. The main control chip U3 of the lock sends an opening door command to the motor drive chip U8, and the motor drive chip U8 drives the motor to rotate clockwise, when the optocoupler sensor U31 detects the second baffle of the lock body and the Hall sensor VR1 detects the magnetic column, it means the automatic unlocking in position, the motor drive chip U8 drives the motor to stop rotating under the control of the main control chip U3, and then the drag-back operation is performed, the motor drive chip U8 drives the motor to rotate counterclockwise, when the optocoupler sensor U21 detects the first baffle of the lock body, the motor drive chip U8 drives the motor to stop rotating under the control of the main control chip U3, and the entire unlocking operation is completed.

In the above-mentioned control circuit for the smart lock, the state detection unit 1, the main control chip U3 and the motor driving unit 2 are configured, where the state detection unit 1 includes the optocoupler sensors U21, U31 and the Hall sensor VR1, the optocoupler sensor U21, U31 and the Hall sensor VR1 are used together to detect the locking and unlocking in-position state of the lock body and cooperate with the motor driving unit 2 to realize the retraction of the motor, and the direction of the locking is switched by the changeover setting unit 6 so that the smart lock has two kinds of locking modes, enabling the smart lock to be applied to the left open door or the right open door, which improves the practicality of the smart lock. The control circuit can be applied to the state detection and control of the ordinary smart lock, and is also suitable for the state detection and control of the dead bolt lock, and has strong applicability.

In an embodiment, it is further provided a control method for a control circuit for a smart lock, and the control method includes:

The optocoupler sensor U21 detects whether the state of the lock body is locked in position and the motor is retracted in position so as to form a first in-position signal; the optocoupler sensor U31 detects whether the state of the lock body is unlocked in position and the motor is retracted in position so as to form a second in-position signal. The Hall sensor VR1 detects whether the state of the lock body is unlocked in position so as to form an auxiliary signal; the main control chip U3 outputs a control signal according to the first in-position signal, the second in-position signal and the auxiliary signal; the motor driving unit 2 drives the motor to rotate forward or reverse or stop rotating according to the control signal.

It should be noted that those skilled in the art can clearly understand that the specific implementation process of the above-mentioned control method for the control circuit for the smart lock can refer to the corresponding description in the foregoing control circuit embodiment of the smart lock, which are not repeated described here for the convenience and simplicity of the description.

In addition, after the door is closed and the smart lock is locked, it is determined whether the door closing is abnormal. If it is abnormal, an alarm is issued and if it is not abnormal, the voltage of the battery is detected. When the battery voltage is abnormal, the alarm unit 10 generates an alarm. In addition, the fingerprint is input through the fingerprint unit 9, a keying signal is input through the touch unit 8 and a card swiping signal is input through the card swiping unit, and the door is opened when all the input signals pass the verification. When the Bluetooth unit 7 receives the operation signal of the mobile terminal, the operation signal needs to be parsed, and the remote control is performed according to the parse result. Through a series of operations, for the entire automatic lock, entering the management menu, automatically closing the door, opening the door with a single keypress, restoring factory settings and the process of locking the automatic lock may be performed and the automatic lock will be re-locked if there is misoperation within the set time period.

The above-mentioned management menu process includes modifying the management password, adding user, deleting user, locking mode, language setting, home leaving mode, Bluetooth setting and extension module. Modifying the management password may be entered by the key value 1; adding user may be entered by the key value 2, where key value 1 is adding user password, key value 2 is adding user fingerprint, and key value 3 is adding user card; deleting user may be entered by the key value 3, where key value 1 is deleting user password, key value 2 is deleting user fingerprint, key value 3 is deleting user card; locking mode may be entered by the key value 4, where key value 1 is automatic mode, key value 2 is manual mode; language setting may be entered by the key value 5, where key value 1 is English, key value 2 is Spanish, key value 3 is Portuguese, key value 4 is French, key value 5 is Chinese, and key value 6 is mute mode; the home leaving mode may be entered by the key value 6; the Bluetooth setting may be entered by the key value 7, where key value 1 is to connect Bluetooth, key value 2 is to disconnect Bluetooth, key value 3 is to enable Bluetooth, and key value 4 is to disenable Bluetooth; and the extension function may be entered by the key value 8, where key value 1 is to join the network, and key value 2 is to exit the network.

When adding a user password, two-digit code is first entered. And then the user password of 4 to 10 digits is entered when the code does not exist and belongs to 00 to 19. When the password length and content meet the requirements, the same password is entered again. In order to be added successfully, the entered password must be not associated with existing passwords.

When adding a user fingerprint, two-digit code is first entered. When the code does not exist and belongs to 00 to 99, the number of entries is set and the number of successes is set as 0. Then the image is obtained, the feature is generated, and the number of entries is added by 1, and when successfully generating the feature the number of successes is added by 1. The fingerprint entry is completed when the number of entries is not less than 8 and the number of successes is not less than 5.

When adding a user card, two-digit code is first entered. When the code does not exist and belongs to 00 to 99, the card is swiped, and if the card does not exist, the sector key is verified. When the key is successfully verified, the sector is encrypted, and if the encryption is successful, the user card is successfully added.

When deleting a user password, if the deleted is a single user password two-digit code belonging to 00 to 19 is entered, and the code and its corresponding password are deleted.

When deleting a user fingerprint, the feature is generated in the case of successfully acquiring the image, the corresponding fingerprint ID is searched, and the corresponding fingerprint is deleted. If the image cannot be successfully acquired, two-digit fingerprint code belonging to 00 to 99 is entered, and the fingerprint corresponding to the code is deleted.

When deleting a user card, two-digit card code belonging to 00 to 99 is entered and the card code and its corresponding password are deleted.

When the alarm unit 10 generates an alarm, if the alarm case belongs to the anti-smashing, defense setting, lock body abnormality, low battery and input error, the alarm is performed by voice, and when it belongs to a hijacking alarm, it is reported to the user terminal.

When verifying the input signal, in the case of password verification, after entering the password, the password library is searched when the password length is 4 to 10 digits, if the password can be found, the verification is passed; in the case of fingerprint verification, the finger presses such that the image is acquired and the feature is generated, then the fingerprint corresponding to the feature is searched, if it can be found, the verification is successful; in the case of card verification, the card code is obtained after the card is swiped, then the card code is searched. After the card code is found, the sector key and the encrypted content are verified, if the verification is successful, the encrypted content is modified and the card verification is successful.

During remote control, the task type is parsed when the extension module exists and receives the task. The task type includes reading the door lock information, unlocking command, unlocking record, mode setting, time correction, adding/deleting a key, reading a key, modifying password, adding time policy, querying policy, setting user type, and querying user type.

The above technical contents of the present application are further described by way of examples only so that the reader can understand more easily. However, the embodiments of the present application are not limited thereto, and any technology extending or re-creating according to the present application is protected by the present application. The scope of the application is defined by the claims.

What is claimed is:

1. A control circuit for a smart lock, comprising: a state detection unit, a main control chip, and a motor driving unit; wherein
the state detection unit comprises first and second optocoupler sensors and a Hall sensor, the first and second optocoupler sensors and the Hall sensor are respectively disposed in a lock body of the smart lock; the first optocoupler sensor is configured to detect whether state of the lock body is locked in position and a motor is retracted in position so as to form a first in-position signal, the second optocoupler sensor is configured to detect whether the state of the lock body is unlocked in position and the motor is retracted in position so as to form a second in-position signal, the Hall sensor is configured to detect whether the state of the lock body is unlocked in position so as to form an auxiliary signal; the main control chip is configured to output a control signal according to the first in-position signal, the second in-position signal and the auxiliary signal; and the motor driving unit is configured to be connected to the motor and to drive the motor to rotate forward or reverse or stop rotating according to the control signal, wherein the control circuit further comprises a lock body power supply control element, a clock unit, a voice unit, an indication unit, a touch unit and a Bluetooth unit respectively connected to the main control chip; the control circuit further comprises a power supply unit, the power supply unit comprises first, second and third power management chips which are respectively connected to a voltage stabilizing module, the first power management chip is connected to the indication unit, the touch unit, the clock unit and the lock body power supply control element, the second power management chip is connected to the voice unit, and the third power management chip is connected to the Bluetooth unit.

2. The control circuit for a smart lock according to claim 1, wherein the lock body power supply control element is turned on or off according to a control signal so as to energize or de-energize the lock body.

3. The control circuit for a smart lock according to claim 1, wherein the motor driving unit comprises a motor drive chip, the motor drive chip is connected to the main control chip through first and second voltage stabilizing resistors, and the motor drive chip is also connected to the main control chip through a detecting resistor.

4. The control circuit for a smart lock according to claim 1, wherein the clock unit comprises a clock chip, and pins of the clock chip are also connected to an oscillator.

5. The control circuit for a smart lock according to claim 4, wherein the voice unit comprises a voice chip, and third and fourth voltage stabilizing resistors and a filter capacitor grounded at one end are connected between the voice unit and the main control chip.

6. The control circuit for a smart lock according to claim 5, wherein the indication unit comprises indicator light drive chips, and pins of the indicator light driving chips are respectively connected with indicator lights.

7. The control circuit for a smart lock according to claim 6, wherein the control circuit further comprises a fingerprint unit connected to the main control chip, and the touch unit comprises a touch chip, the fingerprint unit comprises a fingerprint chip, and the Bluetooth unit includes a Bluetooth chip.

8. The control circuit for a smart lock according to claim 1, wherein the control circuit further comprises a low voltage detection unit connected to the main control chip, the low voltage detection unit comprising first, second and third detecting resistors and a capacitor connected to the power supply unit, and the capacitor and the second detecting resistor are respectively connected to the main control chip.

9. A control method for a control circuit for a smart lock, wherein the control circuit comprises a state detection unit, a main control chip, and a motor driving unit, the control circuit further comprises a lock body power supply control element, a clock unit, a voice unit, an indication unit, a touch unit and a Bluetooth unit respectively connected to the main control chip; the control circuit further comprises a power supply unit, the power supply unit comprises first, second and third power management chips which are respectively connected to a voltage stabilizing module, the first power management chip is connected to the indication unit, the touch unit, the clock unit and the lock body power supply control element, the second power management chip is connected to the voice unit, and the third power management chip is connected to the Bluetooth unit, the method comprising:

detecting, by a first optocoupler sensor of the state detection unit, whether state of a lock body is locked in position and a motor is retracted in position so as to form a first in-position signal; detecting, by a second optocoupler sensor of the state detection unit, whether the state of the lock body is unlocked in position and the motor is retracted in position so as to form a second in-position signal; detecting, by a Hall sensor of the state detection unit, whether the state of the lock body is unlocked in position so as to form an auxiliary signal; outputting, by the main control chip, a control signal according to the first in-position signal, the second in-position signal and the auxiliary signal; and driving, by the motor driving unit, the motor to rotate forward or reverse or stop rotating according to the control signal.

\* \* \* \* \*